United States Patent
Leese de Escobar et al.

(10) Patent No.: US 10,761,152 B2
(45) Date of Patent: Sep. 1, 2020

(54) MAGNETIC SENSOR WITH COMBINED HIGH PASS FLUX CONCENTRATOR AND FLUX BIASING CIRCUIT

(71) Applicant: United States Government as represented by the Secretary of the Navy, San Diego, CA (US)

(72) Inventors: Anna Leese de Escobar, Encinitas, CA (US); Robert Lewis Fagaly, Carlsbad, CA (US); Susan Anne Elizabeth Berggren, San Diego, CA (US); Benjamin Jeremy Taylor, Escondido, CA (US); Marcio Calixto de Andrade, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 57 days.

(21) Appl. No.: 16/128,969

(22) Filed: Sep. 12, 2018

(65) Prior Publication Data

US 2020/0081076 A1    Mar. 12, 2020

(51) Int. Cl.
*G01R 33/035* (2006.01)
*G01R 33/00* (2006.01)
*H01F 6/06* (2006.01)

(52) U.S. Cl.
CPC ..... *G01R 33/0356* (2013.01); *G01R 33/0047* (2013.01); *H01F 6/06* (2013.01)

(58) Field of Classification Search
CPC ............ G01R 33/0356; G01R 33/0047; G01R 33/0206; G01R 33/028; G01R 33/038; G01R 33/1215; H01F 6/06; B64G 1/366
See application file for complete search history.

(56) References Cited

U.S. PATENT DOCUMENTS

| | | | | |
|---|---|---|---|---|
| 3,758,854 A * | 9/1973 | Zimmerman | ...... | A61B 5/04005 324/248 |
| 5,488,295 A * | 1/1996 | Seppa | ........... | G01R 33/0356 324/248 |
| 5,600,242 A * | 2/1997 | Hubbell | ............ | G01R 33/0354 324/248 |
| 9,097,751 B1 * | 8/2015 | Longhini | .......... | G01R 33/0354 |

(Continued)

OTHER PUBLICATIONS

R. L. Fagaly; Superconducting Quantum Interference Device Instruments and Applications; Review of Scientific Instruments 77, 2006.
(Continued)

*Primary Examiner* — Nasima Monsur
(74) *Attorney, Agent, or Firm* — Naval Information Warfare Center, Pacific; Kyle Eppele; J. Eric Anderson

(57) ABSTRACT

A superconducting quantum interference device (SQUID) for mobile applications comprising: a superconducting flux transformer having a pickup coil and an input coil, wherein the input coil is inductively coupled to a Josephson junction; a resistive element connected in series between the pickup coil and the input coil so as to function as a high pass filter such that direct current (DC) bias current is prevented from flowing through the input coil; and a flux bias circuit electrically connected in parallel to the superconducting flux transformer between the pickup coil and the input coil so as to reduce motion-induced noise.

8 Claims, 5 Drawing Sheets

(56) References Cited

U.S. PATENT DOCUMENTS

| | | | |
|---|---|---|---|
| 9,476,950 B2 | 10/2016 | Faley et al. | |
| 2006/0202688 A1* | 9/2006 | Woods .................. | G01N 27/902 324/239 |
| 2012/0088674 A1* | 4/2012 | Faley .................... | G01R 33/035 505/162 |

OTHER PUBLICATIONS

A. Shibahara et al.; Primary current-sensing noise thermometry in the millikelvin regime; Philosophical Transactions Royal Society A; 2016.
S. T. Keenan et al.; A high-Tc flip-chip SQUID gradiometer for mobile underwater magnetic sensing; Superconductor Science and Technology; 2010.
M. Faley et al.; Noise analysis of DC SQUIDS with damped superconducting flux transformers; Journal of Physics Conference Series; Jul. 2010.
J. Beyer et al.; Bias conditions of dc-SQUID for a time-domain SQUID multiplexer; Review of Scientific Instruments, vol. 75, No. 2, Feb. 2004.
D. Drung et al.; Highly sensitive and easy-to-use SQUID sensors; IEEE Trans. Appl. Supercond. 17; 2007.
D. F. He et al.; Improving the sensitivity of a high-Tc SQUID at MHz frequency using a normal metal transformer; Institute of Physics Publishing; Supercond. Sci. Technol. 19; 2006.
M. E. Huber et al.; Resonance damping in tightly coupled D.C. SQUIDs via intra-coil resistors; Elsevier; Physica C 351; 2001.

* cited by examiner

Prior Art

Magnetic Sensor

MAGNETIC SENSOR WITH COMBINED HIGH PASS FLUX CONCENTRATOR AND FLUX BIASING CIRCUIT

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 105825.

BACKGROUND OF THE INVENTION

Superconducting Quantum Interference Devices (SQUIDs) are comprised of tiny loops of superconducting material in which Josephson junctions are placed in the loop path. A Josephson junction is a region of material that provides a weak link between two fully superconducting regions. The direct current (DC) SQUID has two symmetrical Josephson junctions. They are able to sense extremely small magnetic fields. Non-uniforms arrays of DC SQUIDs and DC bi-SQUIDs, which are DC SQUIDs with an additional Josephson junction bisecting the superconducting loop, have been modeled in different array designs and coupling schemes to determine their linearity and sensing capacities and have been fabricated in low temperature superconducting materials. A SQUID-based sensor detects minute magnetic fields and is decoupled from the size of the signals wavelength. Hence the device can sense signals in the DC-GHz range, but still be contained fully on a ~1×1 cm chip.

SQUID sensors require an electrical current and/or a magnetic flux bias in order to operate. DC SQUIDs are sensitive devices that may be used for measuring vector components and spatial gradients of magnetic fields, as well as an ability to resolve tiny changes in large signals. These features are particularly useful and have already been implemented in many applications such as low-noise amplifiers, biomagnetic research, nondestructive evaluations, and geomagnetic exploration. In order for the SQUID sensor to function while moving some way is needed to mitigate the changes in the earth's magnetic field due to the movement of the sensor.

SUMMARY

Disclosed herein is a magnetic sensor for mobile applications comprising: a SQUID, a superconducting flux transformer, a resistive element, and a flux bias circuit. The superconducting flux transformer has a pickup coil and an input coil, which is inductively coupled to the SQUID. The resistive element is connected in series between the pickup coil and the input coil so as to function as a high pass filter such that DC bias current below a threshold is impeded from flowing through the input coil. The flux bias circuit is electrically connected in parallel to the superconducting flux transformer between the pickup coil and the input coil so as to provide a DC flux bias to the SQUID.

An embodiment of the magnetic sensor disclosed herein is suitable for measuring time-variable magnetic fields, or field gradients, in mobile applications. This embodiment may be described as comprising a superconducting flux transformer, a SQUID, a resistive element, and a flux bias circuit. The superconducting flux transformer has a pickup coil comprising a base material, which has a phase transition to the superconducting state, for converting a time-variable magnetic flux, or flux gradient, into an electric current. The superconducting flux transformer also has an input coil that is fed by the pickup coil for converting the electric current into an auxiliary magnetic field. The SQUID is inductively coupled to the input coil so as to function as a sensor for the auxiliary magnetic field. The resistive element is connected in series between the pickup coil and the input coil so as to function as a high pass filter such that a flow of DC bias current through the input coil below a threshold is impeded. The flux bias circuit is electrically connected in parallel to the superconducting flux transformer between the pickup coil and the input coil so as to provide a DC flux bias to the SQUID.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed apparatus below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1A:
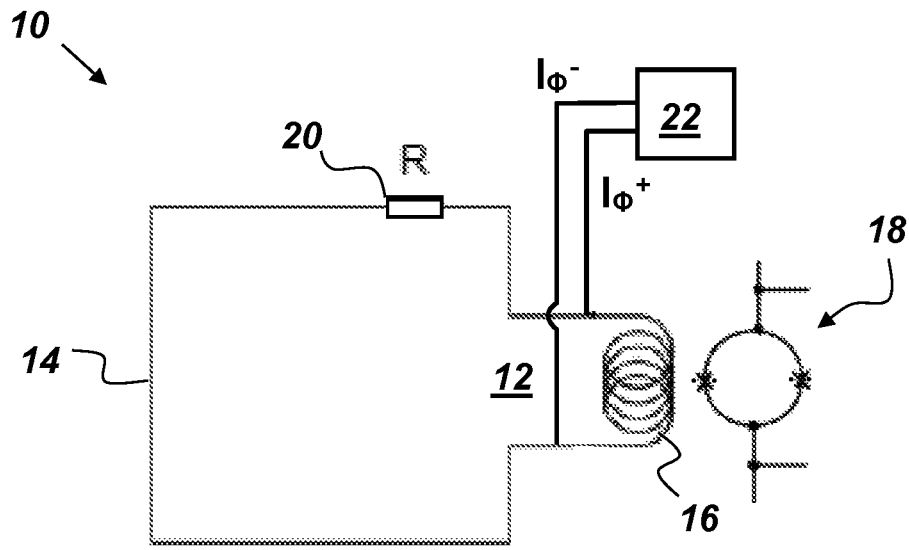
FIGS. 1A and 1B are circuit diagrams of different embodiments of a magnetic sensor.
Figure 1B:
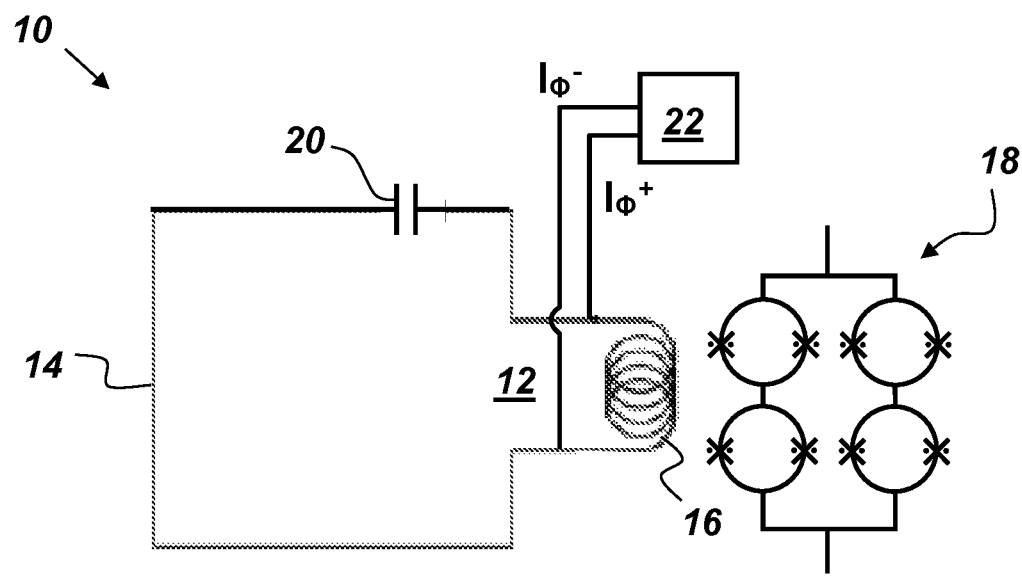

FIGS. 1A and 1B are circuit diagrams of different embodiments of a magnetic sensor 10 that comprises, consists of, or consists essentially of a superconducting flux transformer 12, a SQUID 18, a resistive element 20, and a flux bias circuit 22. The superconducting flux transformer 12 has a pickup coil 14 and an input coil 16, which is inductively coupled to the SQUID 18. The resistive element 20 is connected in series between the pickup coil 14 and the input coil 16 so as to function as a high pass filter such that the flow of DC bias current through the input coil 16 below a threshold is limited. A flux bias circuit 22 is electrically connected in parallel to the superconducting flux transformer 12 between the pickup coil 14 and the input coil 16 so as to provide a DC flux bias to the SQUID.

The magnetic sensor 10 is suitable for measuring time-variable magnetic fields, or field gradients, in mobile applications. The pickup coil 14 of the superconducting flux transformer 12 may comprise a base material, which has a phase transition to the superconducting state, for converting a time-variable magnetic flux, or flux gradient, into an electric current. The input coil 16 may be fed by the pickup coil 14 for converting the electric current into an auxiliary magnetic field. The SQUID, which is inductively coupled to the input coil 16 functions as a sensor for the auxiliary magnetic field. The resistive element 20 serves to impede a flow of DC bias current through the input coil 16 below a threshold. The threshold value may be any desired value depending on the desired performance of the magnetic sensor 10. For example, an embodiment of the magnetic sensor 10 may be used to sense the morphology of the QRS complex in a magnetocardiography application. In such an application, the threshold may be set to 2-3 Hertz (Hz), or for time series traces, the threshold may be set to less than 1 Hz. The magnetic sensor 10 may be used in other applications as well such as, but not limited to, Geophysics, in particular, transient electromagnetics (TEM). In other embodiment of the magnetic sensor 10 the threshold may be set to tens of Hz or higher depending on the application. The unique properties of the magnetic sensor 10 allow it to be used in mobile applications where the magnetic sensor 10 is undergoing angular motion in the Earth's magnetic field.

Any movement of the magnetic sensor 10 in a magnetic field gradient will cause a change in the SQUID 18's output. If the movement is too rapid, it can exceed the slew rate (the ability to track rapid changes) in the SQUID 18 electronics (typically 10^6 Ø o/sec). If only alternating current (AC) data is of interest, the resistive element 20 acts as a high pass filter, killing the DC component and any AC components below the threshold, or "knee" of the high pass filter. Consider rotation in Earth's magnetic field of an embodiment of the magnetic sensor 10 having a sensitivity of 10 fT/√Hz. Rotating this embodiment of the magnetic sensor 180° in the Earth's magnetic field (~50 μT), sweeps out a 100 μT change in detected field, equivalent to needing a 200 dB dynamic range, far in excess of any available SQUID electronics. The sensitivity of 10 fT/√Hz is equivalent to an angular sensitivity of 65 μarc seconds.

Details regarding the manufacturing and use of SQUIDs may be found in the paper, "Superconducting quantum interference device instruments and applications" by R. L. Fagaly, published in REVIEW OF SCIENTIFIC INSTRUMENTS 77, 101101_2006, which paper is incorporated by reference herein. For example, the superconducting flux transformer may be an eight millimeter multilayer flux transformer. In another embodiment, the superconducting flux transformer may be a sixteen millimeter multilayer flux transformer. Embodiments of the superconducting flux transformer may be manufactured as follows. However, it is to be understood that the following manufacturing process is not the only process by which embodiments of the superconducting flux transformer may be made. In one example manufacturing process, a high-oxygen-pressure sputtering technique in pure (99.999%) oxygen at a pressure of about 4 mbar was used to deposit $BaZrO_3$ (BZO), $SrTiO_3$ (STO), $YBa_2Cu_3O_{7-x}$ (YBCO), and $PrBa_2Cu_3O_{7-x}$ (PBCO) films of the SQUID magnetometers from DC or radio frequency (RF) magnetron targets with diameters of 50 mm.

Continuing with the example of the example manufacturing process, the films were approximately 2.5% thinner on the corners of 10 mm×10 mm substrates and 15% thinner on the perimeter of round wafers of diameter 30 mm compared to the film thickness in the middle of the substrates. The deposition from larger targets and the optimized arrangement of the $Sm_2Co_{17}$ magnets in the magnetron target holders improved the thickness homogeneity of the films approximately threefold compared to films produced by a non-magnetron sputtering technique. The deposition rate of the YBCO and PBCO films was ~50 nm/hour while the deposition rate of the non-conducting materials was ~30 nm/hour. The PBCO films together with STO films were used for the insulation layer in crossovers of the multilayer flux transformers and for an integrated resonance-damping resistance in the flux transformer. The effective resistivity of the epitaxial thin film STO insulation was thickness-dependent and was found to be ~$10^5$ Ω×cm for 100-nm-thick STO films, ~$10^8$ Ω×cm for 200-nm-thick STO films, and greater than $10^{10}$ Ω×cm for 300-nm-thick STO films at 77 K. The PBCO film preserved the epitaxial growth of the heterostructural insulator layer on YBCO and provided a resistive damping of the resonances in the flux transformer due to the much smaller resistivity compared to that of STO. The structures were deposited at a substrate temperature of about 800° C. and then cooled down with an oxygenation step lasting one hour at 500° C. in 1 bar of pure (99.999%) molecular oxygen. This was followed by cooling down to room temperature at a rate of 10° C./min. The transition temperature of the YBCO films was 91-93 K and the critical current 3-6 MA/$cm^2$ at 77 K.

In the example manufacturing process mentioned above, the multilayer flux transformer and DC SQUID were produced on separate MgO substrates both buffered by a 300-nm-thick epitaxial STO/BZO-bilayer. In the magnetometer, the input coil of the flux transformer was coupled in a flip-chip arrangement to the washer of the DC SQUID with a diameter of 1 mm. The flux transformers were made on single crystal substrates up to 30 mm in diameter and were later shaped by a diamond saw and emery paper. The Josephson junctions of the DC SQUIDs were produced on 24° bicrystal substrates. The junctions were ~2 μm wide and ~100 nm thick. The resistance of the junctions was ~5 Ω and the critical current ~25 μA at 77 K. Patterning of the structures was performed by ion beam etching with the exception of the non-aqueous Br-ethanol etching of the first two layers of the multilayer flux transformers. AZ5214 and AZMIR701 photoresists were used for structuring with ion beam etching while Br-ethanol etching was performed with a PMMA photoresist mask.

The resistive element 20 may be any device configured to impede current flow in the pickup coil 12. For example, suitable embodiments of the resistive element 20 include, but are not limited to, a resistor, a capacitor, and a weak link or a Josephson junction integrated in series with the pickup coil 14. The resistive element 20 may have any desired value depending on the desired application of the magnetic sensor 10. For example, in one embodiment of the magnetic sensor 10, the resistive element 20 has an electric resistance between $10^{-11}$ Ω and $10^{-5}$ Ω or at least one tunnel contact. FIG. 1A shows an embodiment of the magnetic sensor 10 where the resistive element 20 is a resistor. FIG. 1B shows an embodiment of the magnetic sensor 10 where the resistive element 20 is a capacitor.

The resistive element 20 constitutes an RL-circuit-based high-pass filter (HPF) integrated in the superconducting flux transformer 12 for passive reduction of the currents induced by slow-changing (time constant>1 sec) background magnetic fields. For comparison, SQUIDs with a normal conducting flux transformer have a cutoff frequency of ~10 kHz and they are sensitive only at operation frequencies of ~1 MHz. Others have tried high-temperature superconducting wires, but have failed to demonstrate sufficient sensitivity and the wires were too bulky for integration into multichannel systems. Usually, the flux transformer for sensitive SQUID magnetometers is produced from a closed superconducting circuit with no resistive elements introduced in series. The superconducting current can flow in such a flux transformer without dissipation for many years. This corresponds to dissipation time constant t=L/R>108 sec and a resistance below 10-16 W at the inductance ~10 nH for a bulky ring with a diameter of ~1 cm. In the case of high-temperature superconductors, a flux-creep-induced resistance of r»6×10-18 W cm exists, leading to the effective resistance ~10-13 W and a time constant t»107 sec for the inductance of the flux transformer ~2 µH. This means, that for effective dissipation of the superconducting current the flux-creep induced dissipation time constant of the fully superconducting flux transformer 14 is too long. Thinning and/or degrading the superconducting film could reduce the dissipation time constant, but could also degrade the long time stability of the sensors. The flux-creep-induced resistance is strongly dependent on temperature and exponentially decreases with a reduction in the circulating superconducting current.

Figure 2:
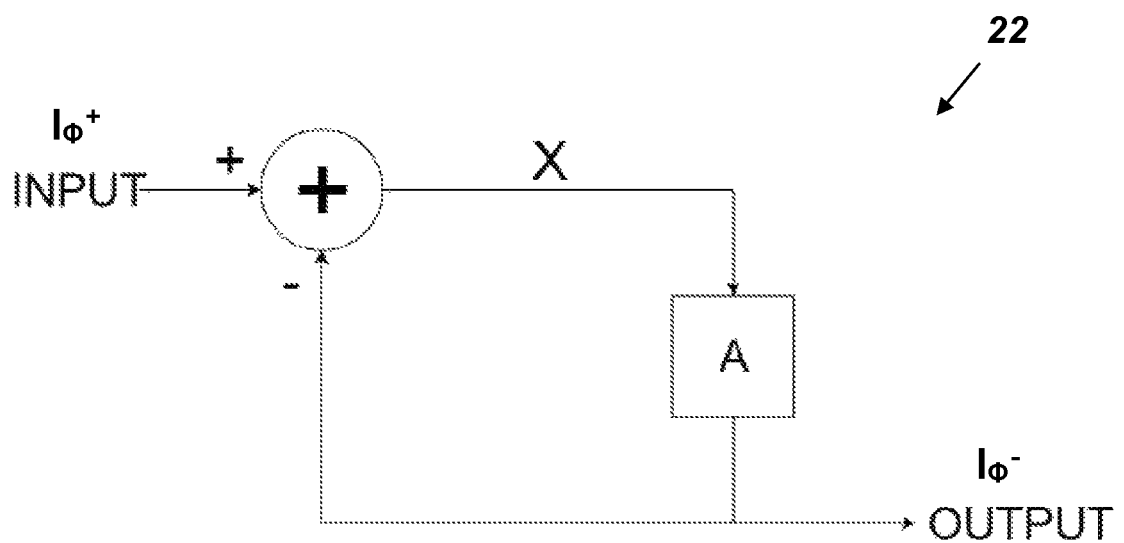
FIG. 2 is a circuit diagram of a flux bias circuit.

FIG. 2 is a circuit diagram of an example flux bias circuit 22. The flux bias circuit 22 may be designed in a variety of ways with some technical differences. A suitable example of the flux bias circuit 22 includes, but is not limited to, a bias control loop, which is a negative feedback loop for keeping a condition constant (in this case, the flux). The example of the flux bias circuit 22 depicted in FIG. 2 is a simple, negative feedback loop, a buffer. It is to be understood that more complicated negative feedback loops that are extension of the simple buffer example shown in FIG. 2 may also serve as the flux bias circuit 22. If the gain A is much larger (>>) than unity, the output I$\Phi^-$ of the flux bias circuit 22 is equivalent to a negligibly attenuated input I$\Phi^+$ to the flux bias circuit 22. The output I$\Phi^-$ is the input I$\Phi^+$ scaled by a factor of 1+A−1. To explain further, the input I$\Phi^+$ signal at location X in the flux bias circuit 22 is attenuated dramatically, then the input I$\Phi^+$ signal is then scaled by a factor of (1+A)−1 to result in the output I$\Phi^-$. The flux bias circuit 22 is configured to control the flux bias of the SQUID 18 of the magnetic sensor 10.

The magnetic sensor 10 may be used for sensitive measurements with no magnetic shielding in the Earth's magnetic field. The magnetic sensor 10 may include low-inductance SQUIDs with large voltage swings and SQUID sensors with a HPF integrated in the thin-film multilayer flux transformer. Unlike other SQUID magnetometers that are extremely sensitive to changing magnetic fields such as occurs when moving a prior art SQUID magnetometer in the Earth's magnetic field, the DC response of the pickup coil 14 of the magnetic sensor 10 is attenuated below a threshold value, which allows the superconducting flux transformer 12 to act as a high pass filter, which is an efficient way to account for the changing magnetic field. Thus, the magnetic sensor 10 is suitable for magnetic field-measuring applications as performed from a mobile platform 24 such as is depicted in FIG. 4C.

Figure 3A:
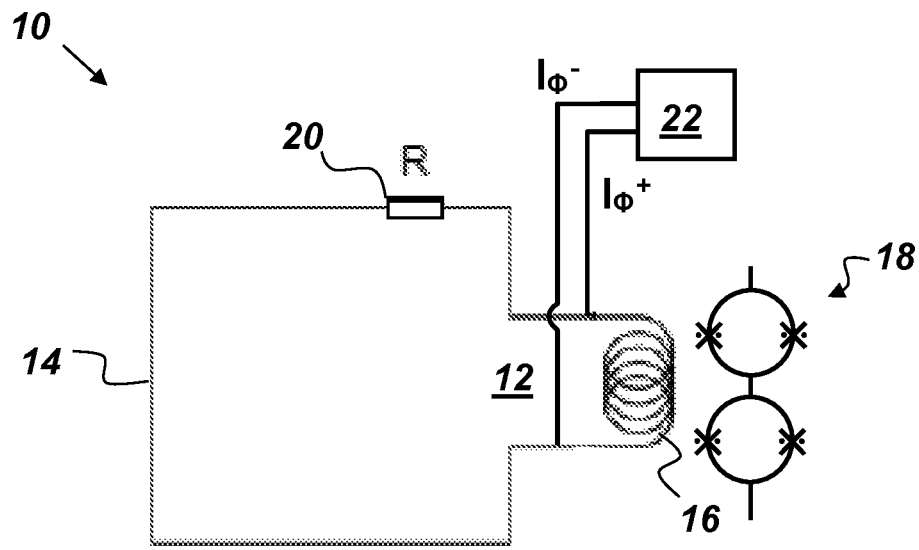
FIGS. 3A and 3B are circuit diagrams of different embodiments of a magnetic sensor.
Figure 3B:
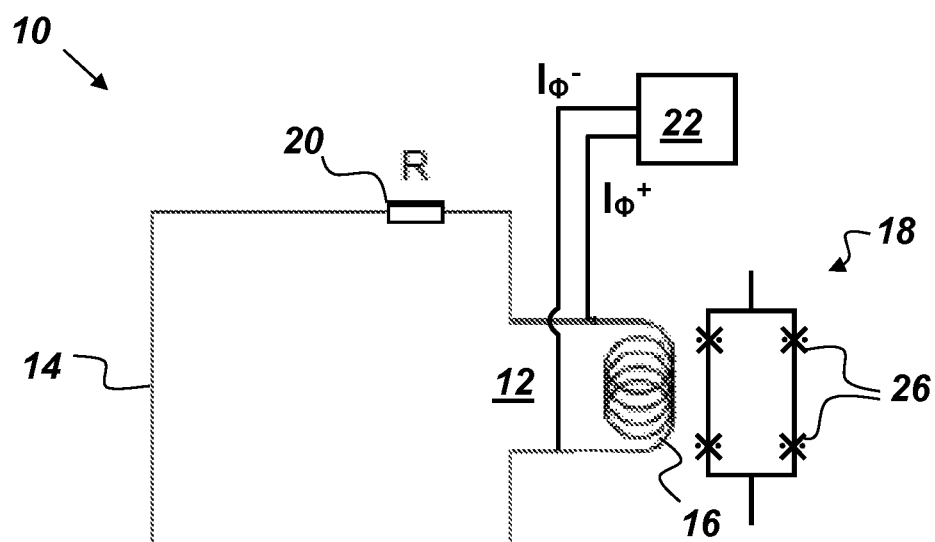

FIGS. 3A and 3B are circuit diagrams of two different embodiments of the magnetic sensor 10. In the embodiment of the magnetic sensor 10 shown in FIG. 3A the SQUID 18 comprises an array of two SQUIDS connected in series. The SQUID 18 may comprise an array of SQUIDS connected in parallel, connected in series, or a combination of series and parallel connections such as is shown in FIG. 1B. In the embodiment of the magnetic sensor 10 shown in FIG. 3B the SQUID 18 comprises an array of Josephson junctions 26, which consists of two sets of Josephson junctions 26 connected in parallel, where each set comprises two Josephson junctions 26 connected in series.

Figure 4A:
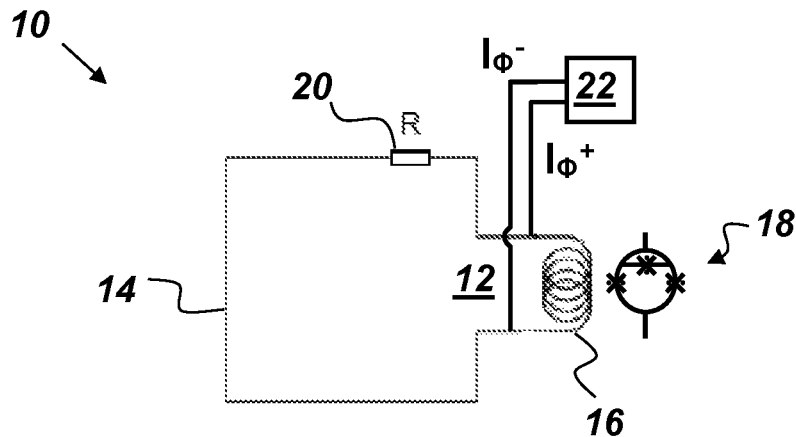
FIGS. 4A and 4B are circuit diagrams of different embodiments of a magnetic sensor.
Figure 4B:
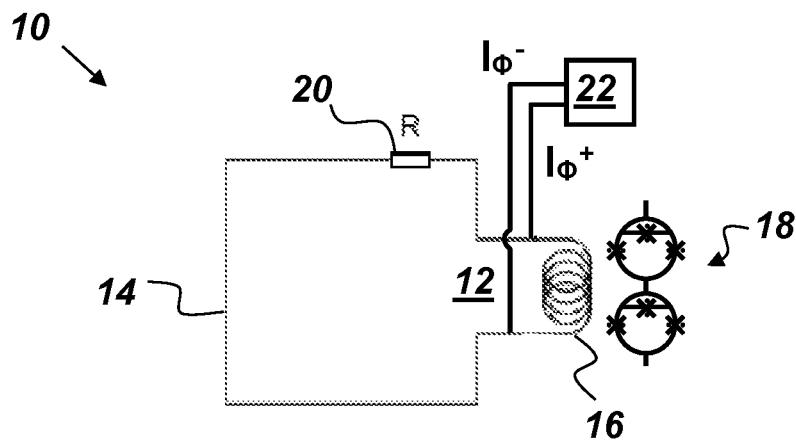
Figure 4C:
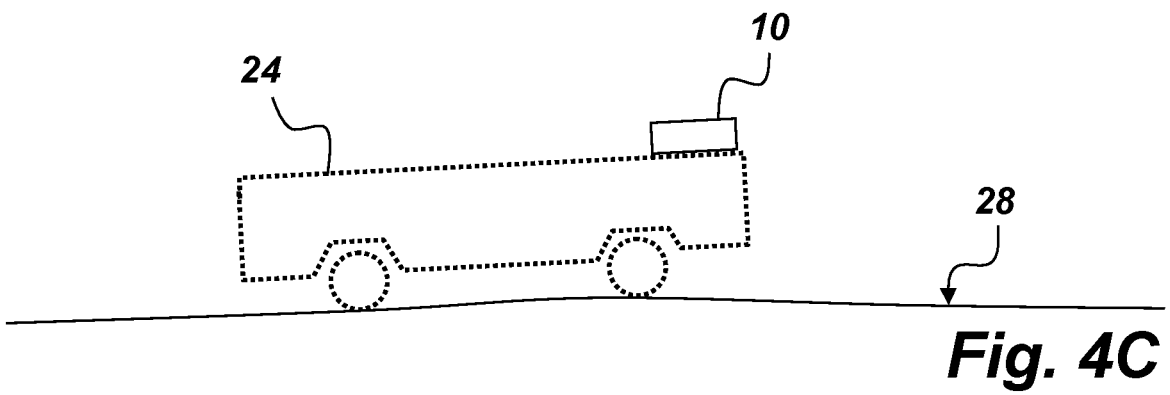
FIG. 4C is an illustration of a mobile platform with a magnetic sensor mounted thereon.

FIG. 4A is a circuit diagram representation of an embodiment of the magnetic sensor 10 where the SQUID 18 is a single bi-SQUID. In the embodiment of the magnetic sensor 10 shown in FIG. 4B, the SQUID 18 comprises an array of two bi-SQUIDS connected in series. FIG. 4C is an illustration of the magnetic sensor 10 mounted to a mobile platform 24 as the mobile platform 24 moves over a surface 28. The mobile platform 24 may be any moving platform including, but not limited to, a ship, an airplane, a spacecraft, a submarine, an animal, and a person. The magnetic sensor 10 may also be mounted to a moving (e.g., a rotating, swinging, etc.) member of a stationary platform.

Figure 5A:
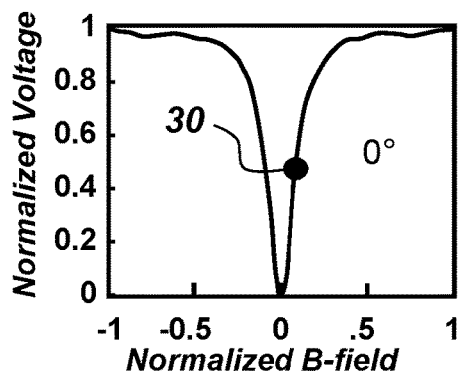
FIGS. 5A-5F are plots showing the voltage-magnetic field response of different devices at different rotational positions with respect to Earth's magnetic field.
Figure 5B:
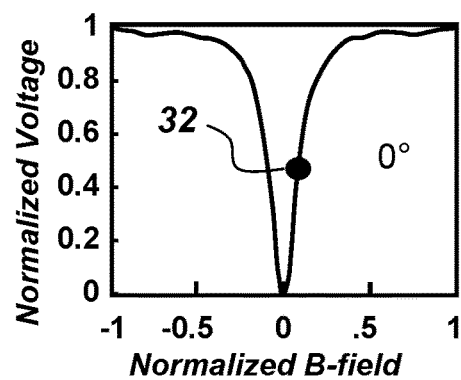
Figure 5C:
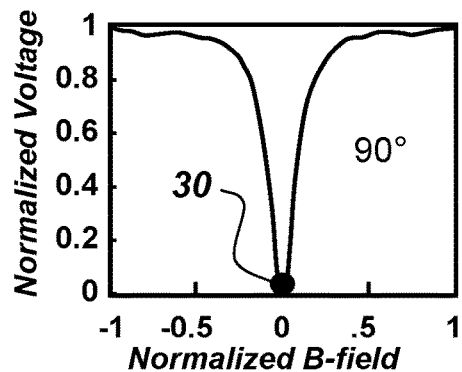
Figure 5D:
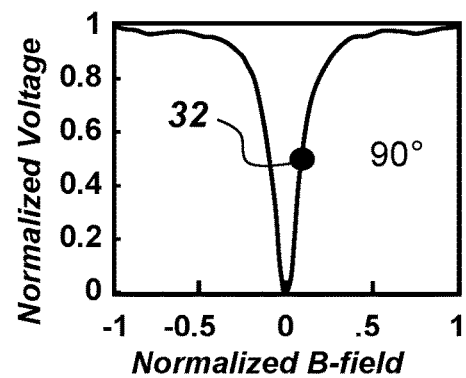
Figure 5E:
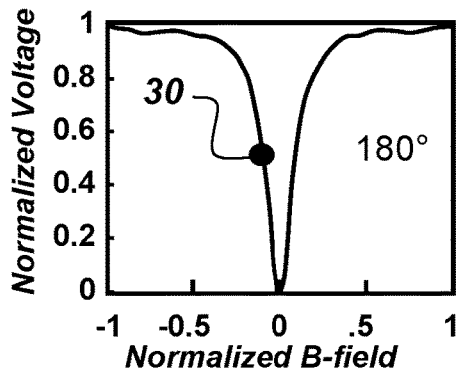
Figure 5F:
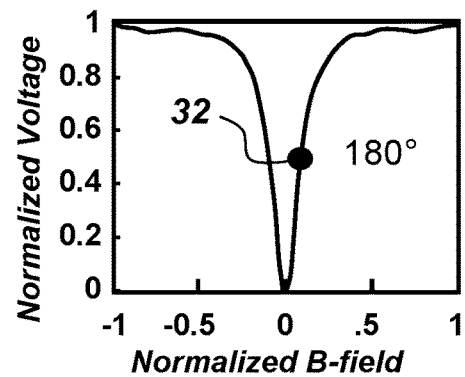

FIGS. 5A, 5C, and 5E are plots showing the voltage-magnetic field response of a prior art SQUID magnetometer as the magnetometer rotates in Earth's magnetic field. The black dot 30 represents the bias point of the prior art SQUID magnetometer. FIGS. 5A, 5C, and 5E show the response of the prior art SQUID magnetometer rotated 0°, 90°, and 180° respectively. As can be seen in FIGS. 5A, 5C, and 5E, the bias point 30 of the prior art SQUID magnetometer moves along the anti-peak as the magnetometer rotates in the Earth's magnetic field. FIGS. 5B, 5D, and 5F, on the other hand, are plots showing the voltage-magnetic field response of the magnetic sensor 10 as it rotates in Earth's magnetic field. The black dot 32 represents the bias point of the magnetic sensor 10. FIGS. 5B, 5D, and 5F show the response of the magnetic sensor 10 rotated 0°, 90°, and 180° respectively. As can be seen in FIGS. 5B, 5D, and 5F, due to the flux bias circuit 22 and the resistive element 20 in the pick-up loop 14, the bias point 32 of the magnetic sensor 10 does not move along the anti-peak as the magnetic sensor 10 rotates in the Earth's magnetic field.

From the above description of the magnetic sensor 10, it is manifest that various techniques may be used for implementing the concepts of the magnetic sensor 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the magnetic sensor 10 is not limited to the particular embodiments described herein, but is capable of many embodiments without departing from the scope of the claims.

We claim:

1. A magnetic sensor for mobile applications comprising:
    a superconducting quantum interference device (SQUID);
    a superconducting, multilayer flux transformer having a pickup coil and an input coil, wherein the input coil is inductively coupled to the SQUID;
    a resistive element connected in series between the pickup coil and the input coil so as to function as a high pass filter such that direct current (DC) bias current below a threshold is impeded from flowing through the input coil;
    a flux bias circuit electrically connected in parallel to the superconducting flux transformer between the pickup coil and the input coil so as to provide a DC flux bias to the SQUID, wherein the resistive element and the flux bias circuit are configured such that a bias point of the magnetic sensor does not change as the magnetic sensor is rotated 0°, 90°, or 180° with respect to Earth's magnetic field, wherein the bias point has a voltage component and a B-field component, and wherein the flux bias circuit is a negative feedback loop for keeping a magnetic flux constant by scaling an input into the flux bias circuit by a factor of (1+ gain) -1;

wherein the superconducting flux transformer is a 16 millimeter multilayer flux transformer; and wherein the magnetic sensor is mounted to a mobile platform.

2. The magnetic sensor of claim 1, wherein the SQUID is a flip-chip DC SQUID magnetometer.

3. The magnetic sensor of claim 1, wherein the resistive element is a resistor.

4. The magnetic sensor of claim 1, wherein the resistive element is a capacitor.

5. The magnetic sensor of claim 1, wherein the SQUID is an array of SQUIDs.

6. The magnetic sensor of claim 1, wherein the SQUID is a Josephson junction array.

7. The magnetic sensor of claim 1, wherein the SQUID is a single bi-SQUID.

8. The magnetic sensor of claim 1, wherein the SQUID is an array of bi-SQUIDs.

\* \* \* \* \*